United States Patent
Nagai et al.

(10) Patent No.: US 7,348,199 B2
(45) Date of Patent: Mar. 25, 2008

(54) WAFER DIVIDING METHOD

(75) Inventors: Yusuke Nagai, Tokyo (JP); Masaru Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 332 days.

(21) Appl. No.: 11/167,848

(22) Filed: Jun. 28, 2005

(65) Prior Publication Data

US 2006/0009010 A1   Jan. 12, 2006

(30) Foreign Application Priority Data

Jul. 7, 2004   (JP) .............................. 2004-200357

(51) Int. Cl.
   *H01L 21/00*   (2006.01)
(52) U.S. Cl. ..................... 438/33; 438/68; 438/458
(58) Field of Classification Search .............. 438/33, 438/68, 113, 114, 458, 460, 464
   See application file for complete search history.

(56) References Cited

U.S. PATENT DOCUMENTS

| | | | |
|---|---|---|---|
| 6,803,320 B2* | 10/2004 | Yamamoto ................... 438/710 |
| 6,939,785 B2* | 9/2005 | Kajiyama et al. ............ 438/463 |
| 7,179,722 B2* | 2/2007 | Murata et al. ............... 438/460 |
| 2005/0090077 A1 | 4/2005 | Nagai et al. ................. 438/464 |
| 2005/0170613 A1* | 8/2005 | Murata et al. ............... 438/460 |
| 2005/0170616 A1* | 8/2005 | Murata et al. ............... 438/463 |
| 2005/0259459 A1* | 11/2005 | Nagai et al. ................. 365/63 |
| 2005/0282359 A1* | 12/2005 | Nagai et al. ................. 438/459 |

FOREIGN PATENT DOCUMENTS

| | | |
|---|---|---|
| JP | 2002-192370 | 7/2002 |
| JP | 3408805 | 3/2003 |
| JP | 2005-129607 | 5/2005 |

* cited by examiner

*Primary Examiner*—Thao P. Le
(74) *Attorney, Agent, or Firm*—Smith, Gambrell & Russell, LLP (57) ABSTRACT

A wafer processing method of dividing a wafer having function elements formed in areas sectioned by dividing lines formed on the front surface in a lattice pattern, into individual chips along the dividing lines, which comprises a deteriorated layer forming step for forming a deteriorated layer in the inside of the wafer along the dividing lines; a wafer supporting step for putting the back surface of the wafer on an extensible support tape mounted on an annular frame; and a dividing step for dividing the wafer along the dividing lines by expanding the support tape affixed to the wafer, wherein the dividing step comprises first dividing the wafer along dividing lines extending in a predetermined direction and subsequently, along dividing lines extending in a direction intersecting with the predetermined direction by expanding the support tape such that tensile force acting in a direction perpendicular to the dividing lines extending in the predetermined direction becomes larger than tensile force acting in a direction perpendicular to the dividing lines extending in the direction intersecting with the predetermined direction, when the supporting tape affixed to the wafer is expanded.

6 Claims, 10 Drawing Sheets

WAFER DIVIDING METHOD

FIELD OF THE INVENTION

The present invention relates to a method of dividing a wafer having function elements formed in areas sectioned by dividing lines formed in a lattice pattern on the front surface, along the dividing lines.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a circuit (function element) such as IC or LSI is formed in each of the sectioned areas. Individual semiconductor chips are manufactured by cutting this semiconductor wafer along the dividing lines to divide it into the areas having a circuit formed thereon. An optical device wafer comprising light-receiving elements (function elements) such as photodiodes or light-emitting elements (function elements) such as laser diodes laminated on the front surface of a sapphire substrate is also cut along dividing lines to be divided into individual optical devices such as photodiodes or laser diodes, and these optical devices are widely used in electric equipment.

Cutting along the dividing lines of the above semiconductor wafer or optical device wafer is generally carried out by using a cutting machine called "dicer". This cutting machine comprises a chuck table for holding a workpiece such as a semiconductor wafer or an optical device wafer, a cutting means for cutting the workpiece held on the chuck table, and a cutting-feed means for moving the chuck table and the cutting means relative to each other. The cutting means comprises a spindle unit that is equipped with a rotary spindle, a cutting blade mounted on the spindle and a drive mechanism for driving the rotary spindle. The cutting blade comprises a disk-like base and an annular cutting edge, which is mounted on the side wall peripheral portion of the base and formed to have a thickness of about 20 µm by fixing diamond abrasive grains having a diameter of about 3 µm to the base by electroforming.

Since the cutting blade has a thickness of about 20 µm, however, the dividing lines for sectioning chips must have a width of about 50 µm and hence, the area ratio of the dividing lines to the area of the wafer is large, thereby reducing productivity. Further, since a sapphire substrate, silicon carbide substrate and the like have high Mohs hardness, cutting with the above cutting blade is not always easy.

Meanwhile, as a means of dividing a plate-like workpiece such as a semiconductor wafer, a laser beam processing method, using a pulse laser beam capable of passing through the workpiece, applies the laser beam to the workpiece with its focusing point set to the inside of the area to be divided is also attempted nowadays, and this laser processing method is disclosed by Japanese Patent No. 3408805. In the dividing method making use of this laser processing technique, the workpiece is divided by applying a pulse laser beam of an infrared range capable of passing through the workpiece to the workpiece, with its focusing point set to the inside, from one surface side of the workpiece, to continuously form a deteriorated layer along the dividing lines in the inside of the workpiece and exerting external force along the dividing lines whose strength has been reduced due to the formation of the deteriorated layers.

As the above method of dividing a wafer having deteriorated layers formed continuously along the dividing lines into individual chips by exerting external force along the dividing lines of the wafer, the applicant of the present invention has been proposed a technology for dividing a wafer into individual chips by expanding a support tape affixed to the wafer to give tensile force to the wafer as JP-A 2005-129607.

Since tensile force acts radially on the wafer when the support tape affixed to the wafer is expanded in the method of applying tensile force to the wafer by expanding the support tape affixed to the wafer, tensile force works in a random direction to the dividing lines formed in a lattice pattern, whereby there occurs a problem in that the wafer is divided irregularly and undivided areas remain. Further, when a wafer having a test metal pattern called "test element group (TEG)" for testing the function of each circuit on dividing lines is divided along the dividing lines by expanding the support tape as described above, irregular force acts on the above metal pattern, whereby the metal pattern is broken jaggedly, produces a contaminant and reduces the quality of the device.

SUMMARY OF THE INVENTION

It is an object of the present invention to provide a wafer dividing method capable of dividing a wafer along dividing lines in which a deteriorated layer has been formed, with certainty by applying a pulse laser beam along the dividing lines of the wafer to form the deteriorated layer.

According to the present invention, firstly, the above object can be attained by a method of dividing a wafer having function elements formed in areas sectioned by dividing lines formed in a lattice pattern on the front surface, into individual chips along the dividing lines, comprising:

a deteriorated layer forming step for forming a deteriorated layer along the dividing lines in the inside of the wafer by applying a laser beam capable of passing through the wafer along the dividing lines, from the back surface side of the wafer;

a wafer supporting step for putting the back surface of the wafer in which the deteriorated layer has been formed along the dividing lines, on an extensible support tape mounted on an annular frame; and a dividing step for dividing the wafer along the dividing lines in which the deteriorated layer has been formed, by expanding the support tape affixed to the wafer, wherein the dividing step is to first divide the wafer along dividing lines extending in a predetermined direction and subsequently, along dividing lines extending in a direction intersecting with the predetermined direction by expanding the support tape such that tensile force acting in a direction perpendicular to the dividing lines extending in the predetermined direction becomes larger than tensile force acting in a direction perpendicular to the dividing lines extending in the direction intersecting with the predetermined direction, when the supporting tape affixed to the wafer is expanded.

According to the present invention, secondly, there is provided a method of dividing a wafer having function elements formed in areas sectioned by dividing lines formed in a lattice pattern on the front surface into, individual chips along the dividing lines, comprising:

a frame supporting step for putting the front surface of the wafer on an extensible support tape mounted on an annular frame;

a deteriorated layer forming step for forming a deteriorated layer in the inside of the wafer along the dividing lines by applying a laser beam capable of passing through the wafer along the dividing lines, from the back surface side of the wafer supported to the annular frame via the support tape; and a dividing step for dividing the wafer along the dividing lines in which the deteriorated layer has been formed, by expanding the support tape affixed to the wafer, wherein the dividing step is to first divide the wafer along dividing lines extending in a predetermined direction and subsequently, along dividing lines extending in a direction intersecting with the predetermined direction by expanding the support tape such that tensile force acting in a direction perpendicular to the dividing lines extending in the predetermined direction becomes larger than tensile force acting in a direction perpendicular to the dividing lines extending in the direction intersecting with the predetermined direction, when the supporting tape affixed to the wafer is expanded.

In the above dividing step, a tape expanding apparatus comprising an annular frame holding member for holding an annular frame and an expansion drum, which is arranged within the annular frame holding member and expands a support tape by being moved relative to the annular frame holding member in an axial direction is used; when the annular frame is held on the annular frame holding member, the annular frame is fixed to the annular frame holding member at positions opposed to each other and perpendicular to the dividing lines that are formed on the wafer supported to the annular frame via the support tape and extend in the predetermined direction; and the annular frame is slightly deformed due to tensile force acting on the support tape at the time when the support tape is expanded by moving the expansion drum and the annular frame holding member relative to each other.

Further, in the above dividing step, a tape expanding apparatus comprising an annular frame holding member for holding the annular frame and an expansion drum, which is arranged within the annular frame holding member and expands the support tape by being moved relative to the annular frame holding member in an axial direction, the upper edge acting on the support tape of the expansion drum having higher portions and lower portions formed alternately at a phase of 90°, is used; the annular frame is held on the annular frame holding member in such a manner that the dividing lines that are formed on the wafer supported to the annular frame via the support tape and extend in the predetermined direction become perpendicular to a direction for connecting the lower portions of the expansion drum at the time when the annular frame is held on the annular frame holding member; and the upper edge of the expansion drum is caused to act on the support tape so as to expand the support tape by moving the expansion drum and the annular frame holding member relative to each other.

According to the wafer dividing method of the present invention, since the wafer is first divided along the dividing lines extending in the predetermined direction and subsequently, along the dividing lines extending in the direction perpendicular to the predetermined direction by expanding the support tape affixed to the wafer in which the deteriorated layer is formed along the dividing lines such that tensile force acting in a direction perpendicular to the dividing lines extending in the predetermined direction becomes larger than tensile force acting in a direction crossing at right angles to the dividing lines extending in the direction perpendicular to the predetermined direction, the wafer is divided regularly, thereby making it possible to divide the wafer along the dividing lines in which the deteriorated layer has been formed, with certainty.

BRIEF DESCRIPTION OF THE DRAWINGS

FIGS. 5(*a*) and 5(*b*) are explanatory diagrams showing the deteriorated layer forming step in the wafer dividing method of the present invention;

FIGS. 11(*a*) and 11(*b*) are diagrams showing states where the frame holding member is located at an expansion position in the dividing step using the tape expanding apparatus shown in FIG. 8;

FIGS. 15(*a*) and 15(*b*) are diagrams for explaining the dividing step using the tape expanding apparatus shown in FIG. 12.

DETAILED DESCRIPTION OF THE PREFERRED EMBODIMENTS

Preferred embodiments of the present invention will be described in detail hereinunder with reference to the accompanying drawings.

Figure 1:
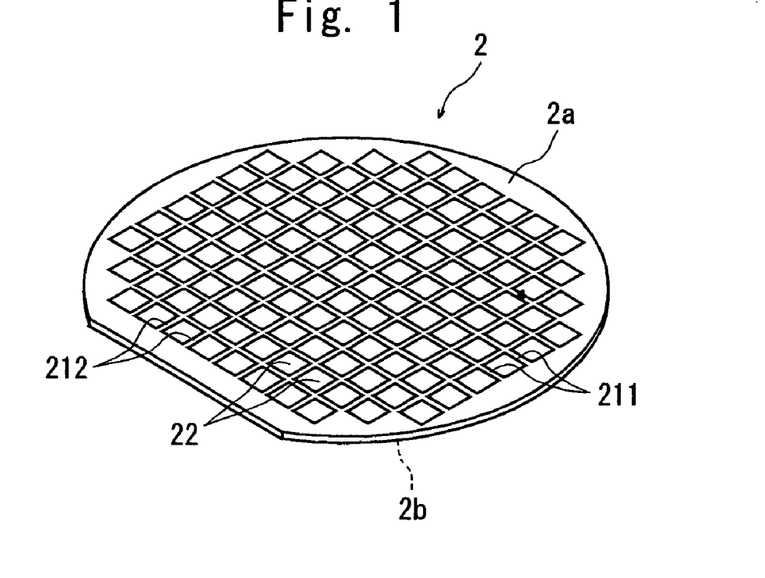
FIG. 1 is a perspective view of a semiconductor wafer as a wafer to be divided by the wafer dividing method of the present invention.

FIG. 1 is a perspective view of a semiconductor wafer as a wafer to be processed according to the present invention. The semiconductor wafer 2 shown in FIG. 1 is a silicon wafer having a thickness of, for example, 500 μm, and a plurality of first dividing lines 211 extending in a predetermined direction in parallel to each other and a plurality of second dividing lines 212 extending, in parallel to each other, in a direction perpendicular to the above first dividing lines 211 are formed in a lattice pattern on the front surface 2a. Circuits 22 as function elements are formed on the front surface 2a of the semiconductor wafer 2 in a plurality of areas sectioned by the first dividing lines 211 and the second dividing lines 212. The method of dividing this semiconductor wafer 2 into individual semiconductor chips will be described hereinunder.

To divide the semiconductor wafer 2 into individual semiconductor chips, a step of forming a deteriorated layer in the inside of the semiconductor wafer 2 along the first dividing lines 211 and the second dividing lines 212 by applying a pulse laser beam capable of passing through the semiconductor wafer 2 along the first dividing lines 211 and the second dividing lines 212 is carried out. This deteriorated layer forming step is carried out by using a laser beam processing machine 3 shown in FIGS. 2 to 4. The laser beam processing machine 3 shown in FIGS. 2 to 4 comprises a chuck table 31 for holding a workpiece, a laser beam application means 32 for applying a laser beam to the workpiece held on the chuck table 31, and an image pick-up means 33 for picking up an image of the workpiece held on the chuck table 31. The chuck table 31 is so constituted as to suction-hold the workpiece and is designed to be moved in a processing-feed direction indicated by an arrow X and an indexing direction indicated by an arrow Y in FIG. 2 by a moving mechanism that is not shown.

Figure 3:
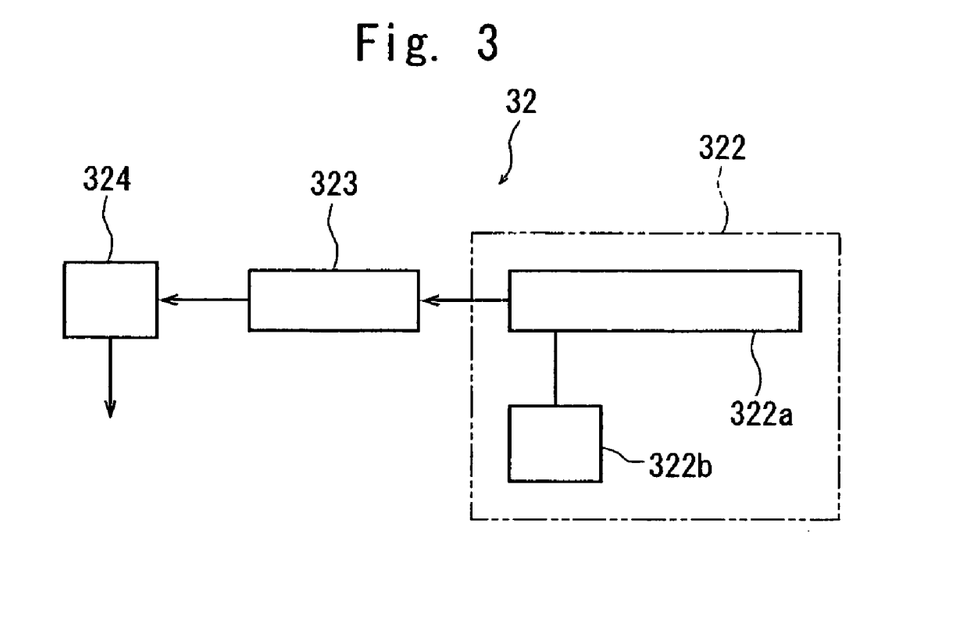
FIG. 3 is a block diagram schematically showing the constitution of laser beam application means provided in the laser beam processing machine shown in FIG. 2.
Figure 4:
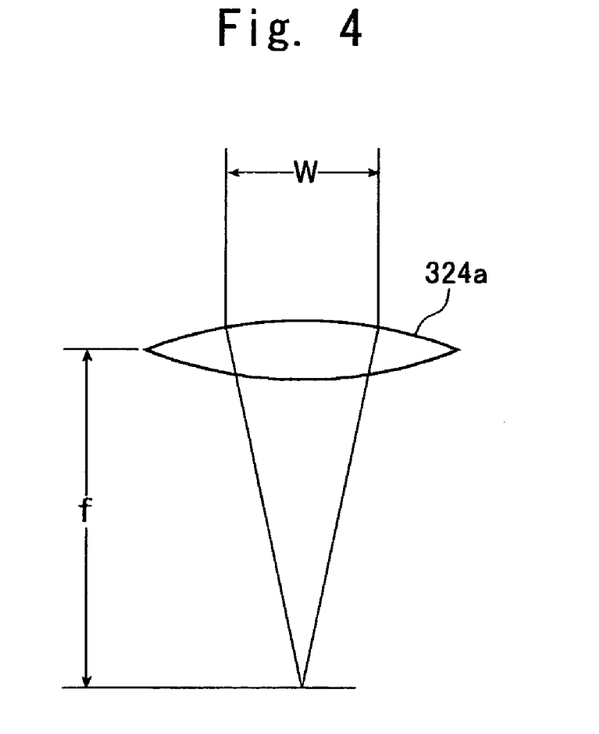
FIG. 4 is a schematic diagram for explaining the focusing spot diameter of a pulse laser beam.

The above laser beam application means 32 has a cylindrical casing 321 arranged substantially horizontally. In the casing 321, as shown in FIG. 3, there are installed a pulse laser beam oscillation means 322 and a transmission optical system 323. The pulse laser beam oscillation means 322 comprises a pulse laser beam oscillator 322a composed of a YAG laser oscillator or YVO4 laser oscillator and a repetition frequency setting means 322b connected to the pulse laser beam oscillator 322a. The transmission optical system 323 comprises suitable optical elements such as a beam splitter, etc. A condenser 324 housing condensing lenses (not shown) constituted by a set of lenses that may be formation known per se is attached to the end of the above casing 321. A laser beam oscillated from the above pulse laser beam oscillation means 322 reaches the condenser 324 through the transmission optical system 323 and is applied from the condenser 324 to the workpiece held on the above chuck table 31 at a predetermined focusing spot diameter D. This focusing spot diameter D is defined by the expression D (μm)=4×λ×f/(π×W) (wherein λ is the wavelength (μm) of the pulse laser beam, W is the diameter (mm) of the pulse laser beam applied to an objective lens 324a, and f is the focusing distance (mm) of the objective lens 324a) when the pulse laser beam showing a Gaussian distribution is applied through the objective lens 324a of the condenser 324 as shown in FIG. 4.

Figure 2:
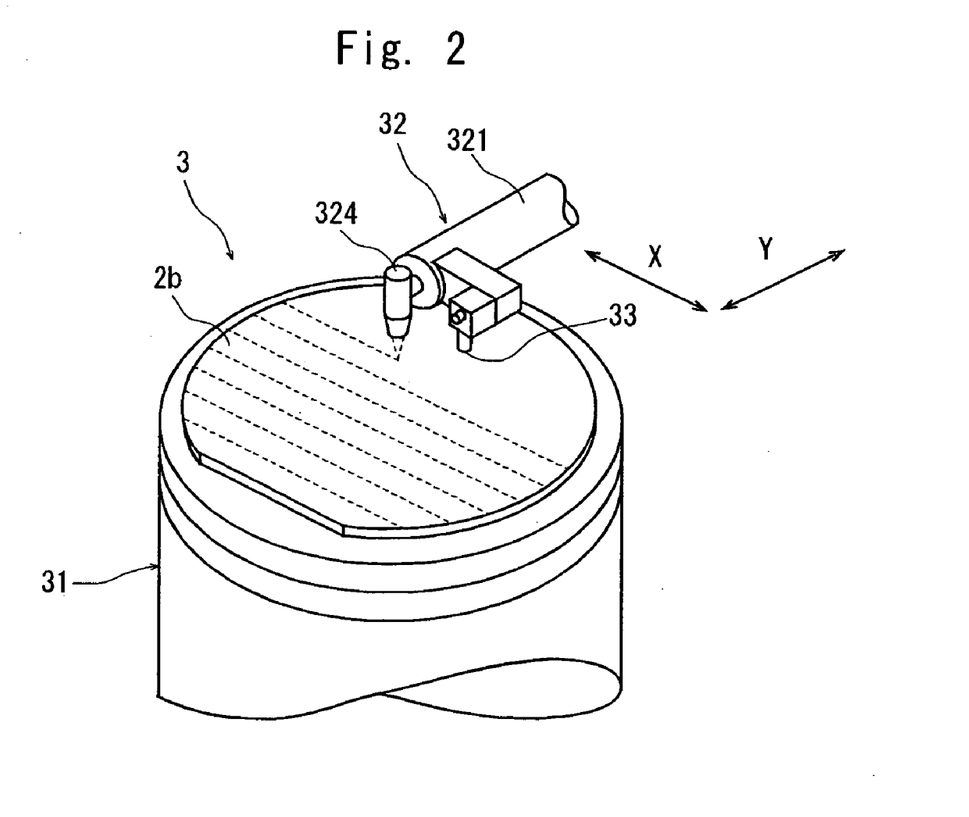
FIG. 2 is a perspective view of the principal section of a laser beam processing machine for carrying out a deteriorated layer forming step in the wafer dividing method of the present invention.

The image pick-up means 33 attached to the end of the casing 321 constituting the above laser beam application means 32 comprises an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation in the illustrated embodiment. An image signal is transmitted to a control means that will be described later.

The deteriorated layer forming step which is carried out by using the above laser beam processing machine 3 will be described with reference to FIG. 2, FIGS. 5(a) and 5(b) and FIG. 6.

In this deteriorated layer forming step, the semiconductor wafer 2 is first placed on the chuck table 31 of the laser beam processing machine 3 shown in FIG. 2 in such a manner that the back surface 2b faces up and suction-held on the chuck table 31. The chuck table 31 suction-holding the semiconductor wafer 2 is positioned right below the image pick-up means 33 by a moving mechanism that is not shown.

After the chuck table 31 is positioned right below the image pick-up means 33, an alignment work for detecting the area to be processed of the semiconductor wafer 2 is carried out by using the image pick-up means 33 and the control means that is not shown. That is, the image pick-up means 33 and the control means (not shown) carry out image processing such as pattern matching, etc. to align a first dividing line 211 formed in a predetermined direction of the semiconductor wafer 2 with the condenser 324 of the laser beam application means 32 for applying a laser beam along the first dividing line 211, thereby performing the alignment of a laser beam application position. The alignment of the laser beam application position is also carried out on the second dividing lines 212 formed on the semiconductor wafer 2. Although the front surface 2a, on which the first dividing lines 21 and the second dividing lines 22 have been formed, of the semiconductor wafer 2 faces down at this point, an image of the dividing line 211 or 212 can be taken through the back surface 2b as the image pick-up means 33 comprises an infrared illuminating means, an optical system for capturing infrared radiation and an image pick-up device (infrared CCD) for outputting an electric signal corresponding to the infrared radiation as described above.

Figure 5:
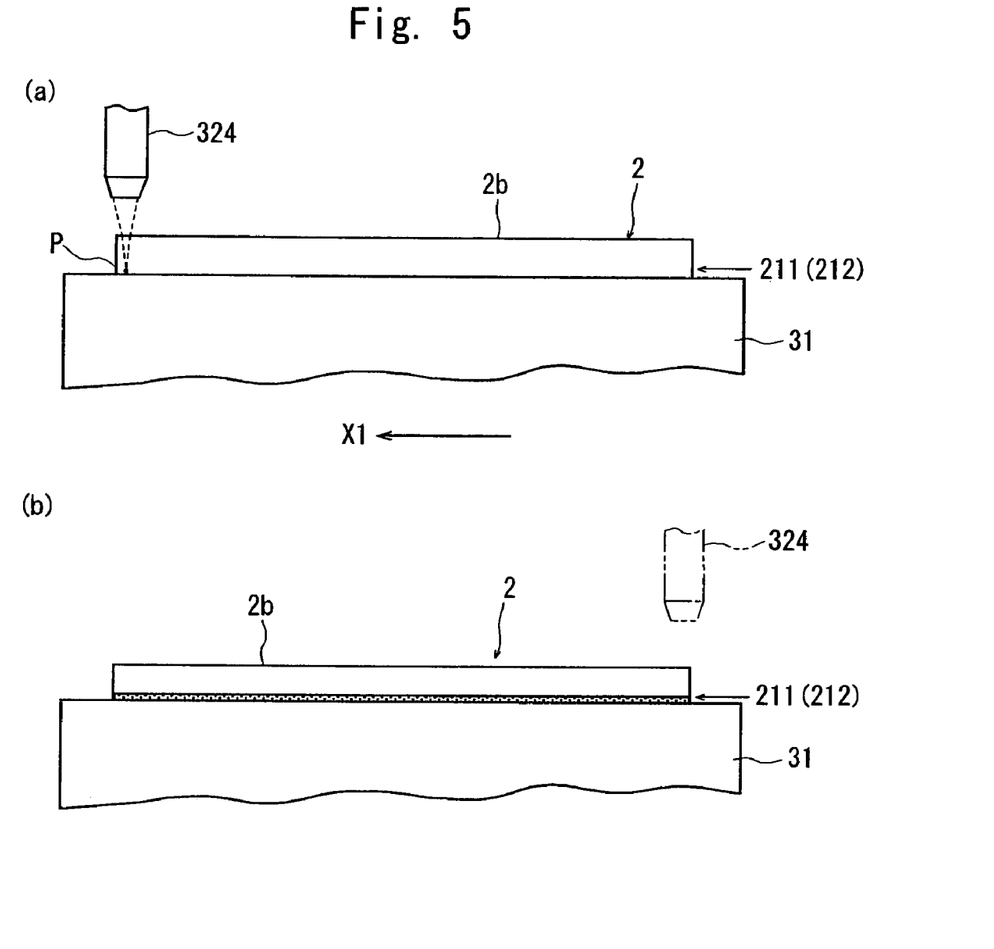

After the first dividing line 211 (or the second dividing line 212) formed on the semiconductor wafer 2 held on the chuck table 31 is detected and the alignment of the laser beam application position is carried out as described above, the chuck table 31 is moved to a laser beam application area where the condenser 324 of the laser beam application means 32 for applying a laser beam is located to bring one end (left end in FIG. 5(a)) of the predetermined first dividing line 211 (or the second dividing line 212) to a position right below the condenser 324 of the laser beam application means 32, as shown in FIG. 5(a). The chuck table 31, that is, the semiconductor wafer 2 is then moved in the direction indicated by the arrow X1 in FIG. 5(a) at a predetermined processing-feed rate while the pulse laser beam capable of passing through the semiconductor wafer 2 is applied from the condenser 324. When the application position of the condenser 324 of the laser beam application means 32 reaches the other end of the first dividing line 211 (or the second dividing line 212) as shown in FIG. 5(b), the application of the pulse laser beam is suspended and the movement of the chuck table 31, that is, the semiconductor wafer 2 is stopped. In this deteriorated layer forming step, a deteriorated layer 210 is exposed to the front surface 2a (undersurface) and formed toward the inside from the front surface 2a by setting the focusing point P of the pulse laser beam to an area near the front surface 2a (undersurface) of the semiconductor wafer 2. This deteriorated layer 210 is formed as a molten-resolidified layer, of which the wafer has been once molten and then re-solidified.

Figure 6:
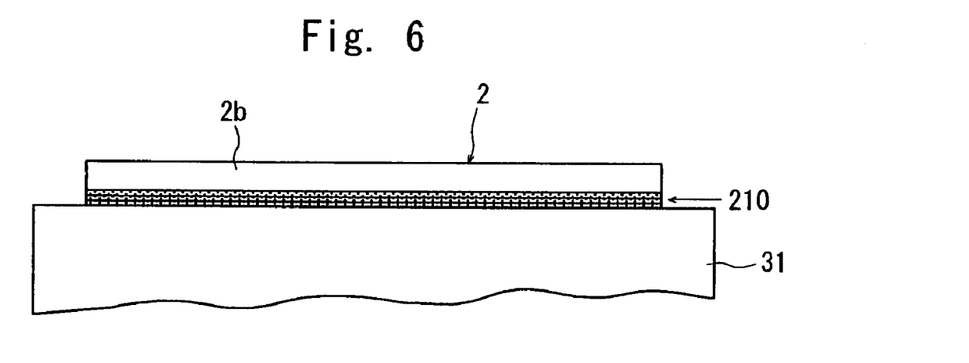
FIG. 6 is an explanatory showing that a plurality of deteriorated layers have been laminated along the dividing line of the wafer by the deteriorated layer forming step in the wafer dividing method of the present invention.

The processing conditions in the above deteriorated layer forming step are set as follows, for example.
Light source: LD excited Q switch Nd:YVO4 laser
Wavelength: pulse laser beam having a wavelength of 1,064 nm
Pulse output: 10 μJ
Focusing spot diameter: 1 μm
Repetition frequency: 100 kHz
Processing-feed rate: 100 mm/sec When the semiconductor wafer 2 is thick, as shown in FIG. 6, the above-described deteriorated layer forming step is carried out several times by changing the focusing point P stepwise so as to form a plurality of deteriorated layers 210. For example, since the thickness of the deteriorated layer formed once under the above processing conditions is about 50 μm, the above deteriorated layer forming step is carried out three times to form deteriorated layers 210 having a total thickness of 150 μm.

Figure 7:
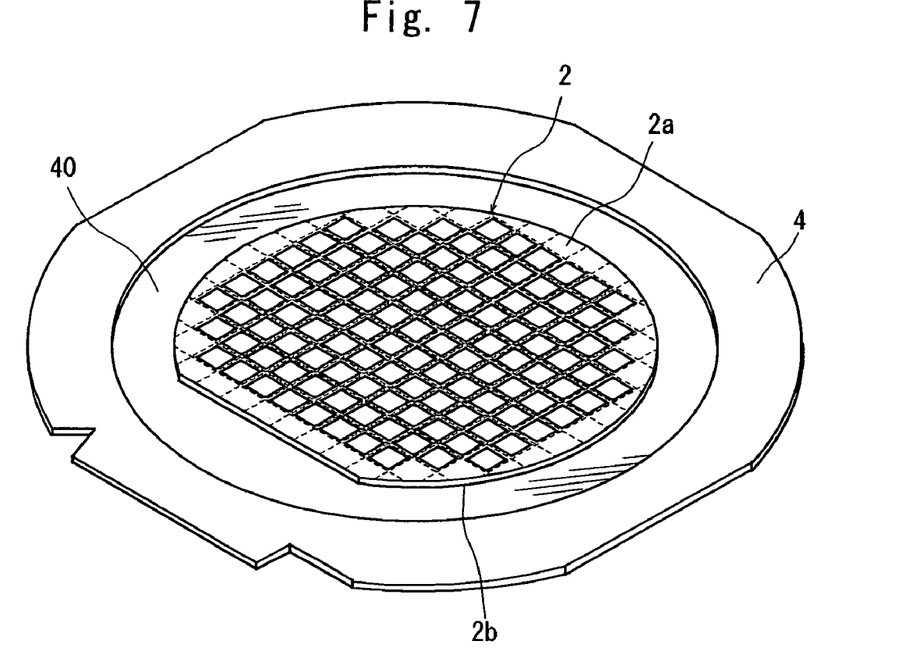
FIG. 7 is a perspective view showing a state where the back surface of a wafer having deteriorated layers formed thereon is put on the surface of a support tape mounted on an annular frame in the wafer supporting step in the wafer dividing method of the present invention.

After the deteriorated layer 210 is formed in the inside of the semiconductor wafer 2 along the first dividing lines 211 and the second dividing lines 212 in the above-described deteriorated layer forming step, a wafer supporting step for putting the back surface 2b of the semiconductor wafer 2 on the surface of an extensible support tape mounted on an annular frame is carried out. That is, as shown in FIG. 7, the back surface 2b of the semiconductor wafer 2 is put on the surface of the extensible support tape 40 whose outer peripheral portion is mounted onto the annular frame 4 so as to cover its inner opening. The above support tape 40 is prepared by applying acrylic resin-based adhesive to the surface of a 70 μm-thick sheet backing made of polyvinyl chloride (PVC) to a thickness of about 5 μm in the illustrated embodiment. The annular frame 4 is made of a 1 mm-thick stainless steel plate and is elastically deformed when predetermined external force acts thereon.

The dividing step for dividing the semiconductor wafer 2 along the first dividing lines 211 and the second dividing lines 212 in which the deteriorated layer 210 has been formed comes after the above wafer supporting step. A first embodiment of this dividing step is carried out by using a tape expanding apparatus 6 shown in FIG. 8. The tape expanding apparatus 6 shown in FIG. 8 comprises a frame holding means 61 for holding the above annular frame 4 and a tape expanding means 62 for expanding the support tape 40 mounted on the annular frame 4 held on the frame holding means 61. The frame holding means 61 comprises an annular frame holding member 611 and two clamps 612 and 612 as a fixing means arranged at the periphery of the frame holding member 611. The top surface of the frame holding member 611 serves as a placing surface 611a for placing the annular frame 4, and the annular frame 4 is placed on this placing surface 611a. The annular frame 4 placed on the placing surface 611a is fixed on the frame holding member 611 by the clamps 612 and 612. The clamps 612 and 612 are arranged so as to oppose to each other on a line passing the center of the frame holding member 611 in the illustrated embodiment. The frame holding means 61 thus constituted is supported by the tape expanding means 62 in such a manner that it can move in the vertical direction.

Figure 8:
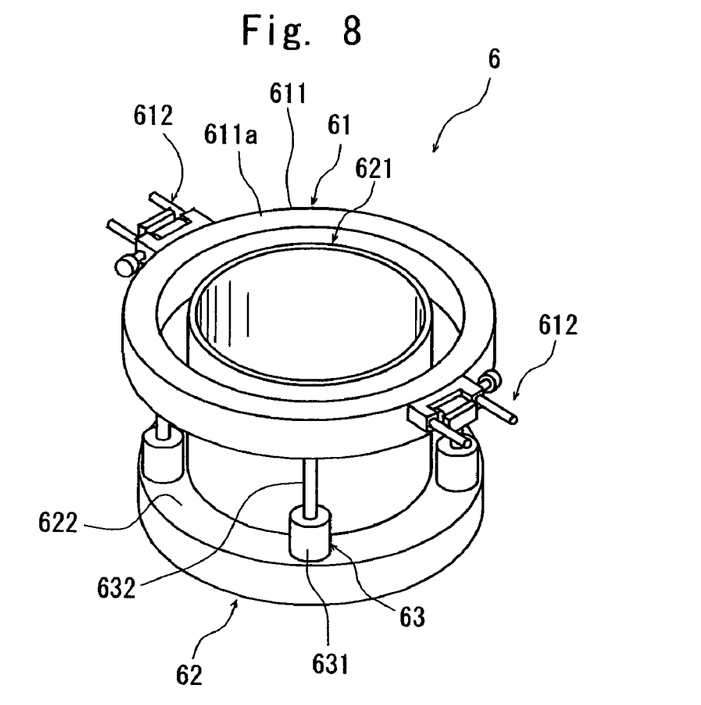
FIG. 8 is a perspective view of an embodiment of the tape expanding apparatus for carrying out the dividing step in the wafer dividing method of the present invention.

The tape expanding means 62 comprises an expansion drum 621 arranged on the inside of the above frame holding member 611. This expansion drum 621 has a smaller inner diameter than the inner diameter of the annular frame 4 and a larger outer diameter than the outer diameter of the semiconductor wafer 2 affixed to the support tape 40 mounted on the annular frame 4. The expansion drum 621 has, at its lower end, a support flange 622. The tape expanding means 62 in the illustrated embodiment has support means 63 that can move the above annular frame holding member 611 in the vertical direction (axial direction). This support means 63 comprises a plurality of air cylinders 631 installed on the above support flange 622, and their piston rods 632 are connected to the undersurface of the above annular frame holding member 611. The support means 63 thus comprising the plurality of air cylinders 631 moves the annular frame holding member 611 in the vertical direction between a standard position where the placing surface 611a becomes substantially flush with the upper end of the expansion drum 621 and an expansion position where the placing surface 611a is positioned below the upper end of the expansion drum 621 by a predetermined distance. Therefore, the support means 63 comprising the plurality of air cylinders 631 functions as an expanding and moving means for moving the frame holding member 611 relative to the expansion drum 621 in the vertical direction (axial direction).

Figure 9:
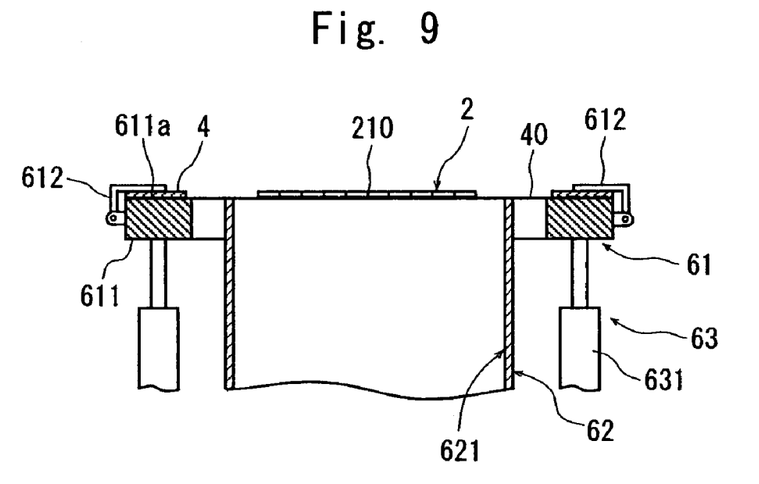
FIG. 9 is an explanatory showing a state where a frame holding member is located at a standard position in the dividing step using the tape expanding apparatus shown in FIG. 8.
Figure 10:
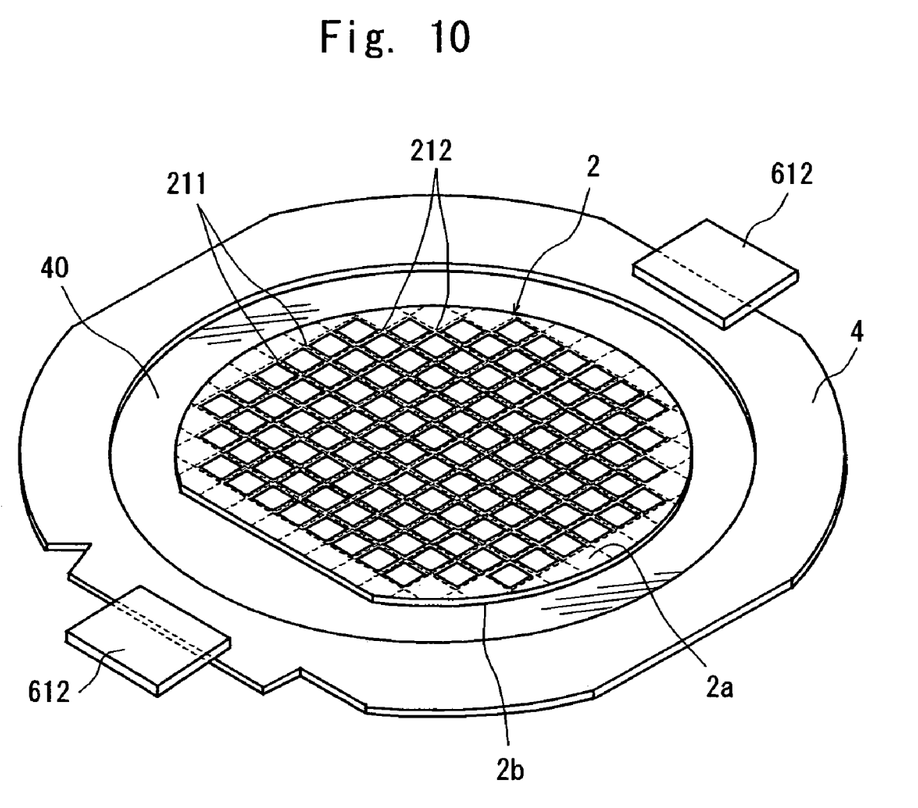
FIG. 10 is an explanatory showing the clamped positions of the annular frame supporting the wafer through the support tape.
Figure 11:
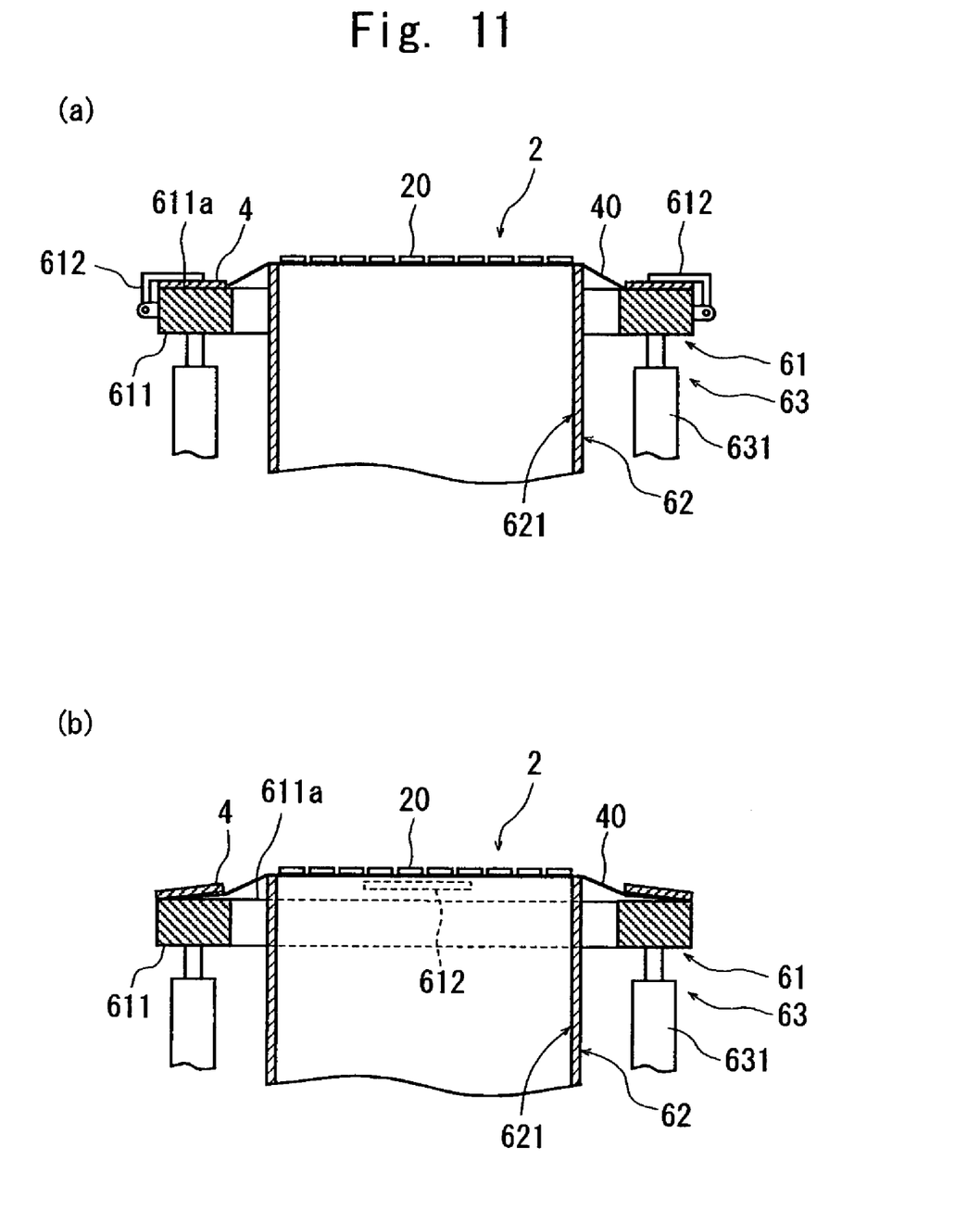

The dividing step which is carried out by using the above constituted tape expanding apparatus 6 will be described with reference to FIGS. 9 to 11. That is, the annular frame 4 supporting the semiconductor wafer 2 (in which the deteriorated layer 210 has been formed along the first dividing lines 211 and the second dividing lines 212) through the support tape 40 as shown in FIG. 9 is placed on the placing surface 611a of the frame holding member 611 constituting the frame holding means 61 and fixed on the frame holding member 611 by the clamps 612 and 612 as shown in FIG. 9. At this point, the annular frame 4 is positioned such that portions opposed to each other along an extension line passing through the center portions of the second dividing lines 212 formed on the semiconductor wafer 2 affixed to the support tape 40 are located at positions of the clamps 612 and 612. Further, the frame holding member 611 is situated at the standard position shown in FIG. 9 at this point.

The annular frame holding member 611 is then lowered to the expansion position shown in FIGS. 11(a) and 11(b) by activating the plurality of air cylinders 631 as the support means 63 of the tape expanding means 62 (tape expanding step) Therefore, as the annular frame 4 fixed on the placing surface 611a of the frame holding member 611 is also lowered, the support tape 40 mounted on the annular frame 4 comes into contact with the upper edge of the expansion drum 621 to be expanded as shown in FIGS. 11(a) and 11(b). At this point, as tensile force working on the support tape 40 acts on the annular frame 4, portions having a phase of 90° (portions not fixed by the clamps 612 and 612) from the portions fixed by the clamps 612 and 612 in the annular frame 4 are elastically deformed as shown in FIG. 11(b). Meanwhile, the portions fixed by the clamps 612 and 612 in the annular frame 4 are not elastically deformed even when tensile force working on the support tape 40 acts thereon as shown in FIG. 11(a). Therefore, as for tensile force acting on the semiconductor wafer 2 affixed to the support tape 40, tensile force acting in a direction perpendicular to the first dividing lines 211 becomes larger than tensile force acting in a direction perpendicular to the second dividing lines 212. As a result, the semiconductor wafer 2 is first fractured along the first dividing lines 211 and subsequently, along the second dividing lines 212 to be divided into individual semiconductor chips 20. Since the semiconductor wafer 2 in which the deteriorated layer 210 has been formed along the first dividing lines 211 and the second dividing lines 212 is first divided along the first dividing lines 211 and subsequently, along the second dividing lines 212 regularly, the semiconductor wafer 2 is divided along the first dividing lines 211 and the second dividing lines 212 without fail, and the test metal pattern formed on the dividing lines is also fractured along the dividing lines accurately.

The quantity of expansion or elongation of the support tape 40 in the above tape expanding step can be adjusted by the quantity of downward movement of the frame holding member 611. According to experiments conducted by the inventors of the present invention, when the support tape 40 was stretched about 20 mm in a direction perpendicular to the first dividing lines 211, the semiconductor wafer 2 could be fractured along the first dividing lines 211 and the second dividing lines 212 in which the deteriorated layer 210 was formed.

Figure 12:
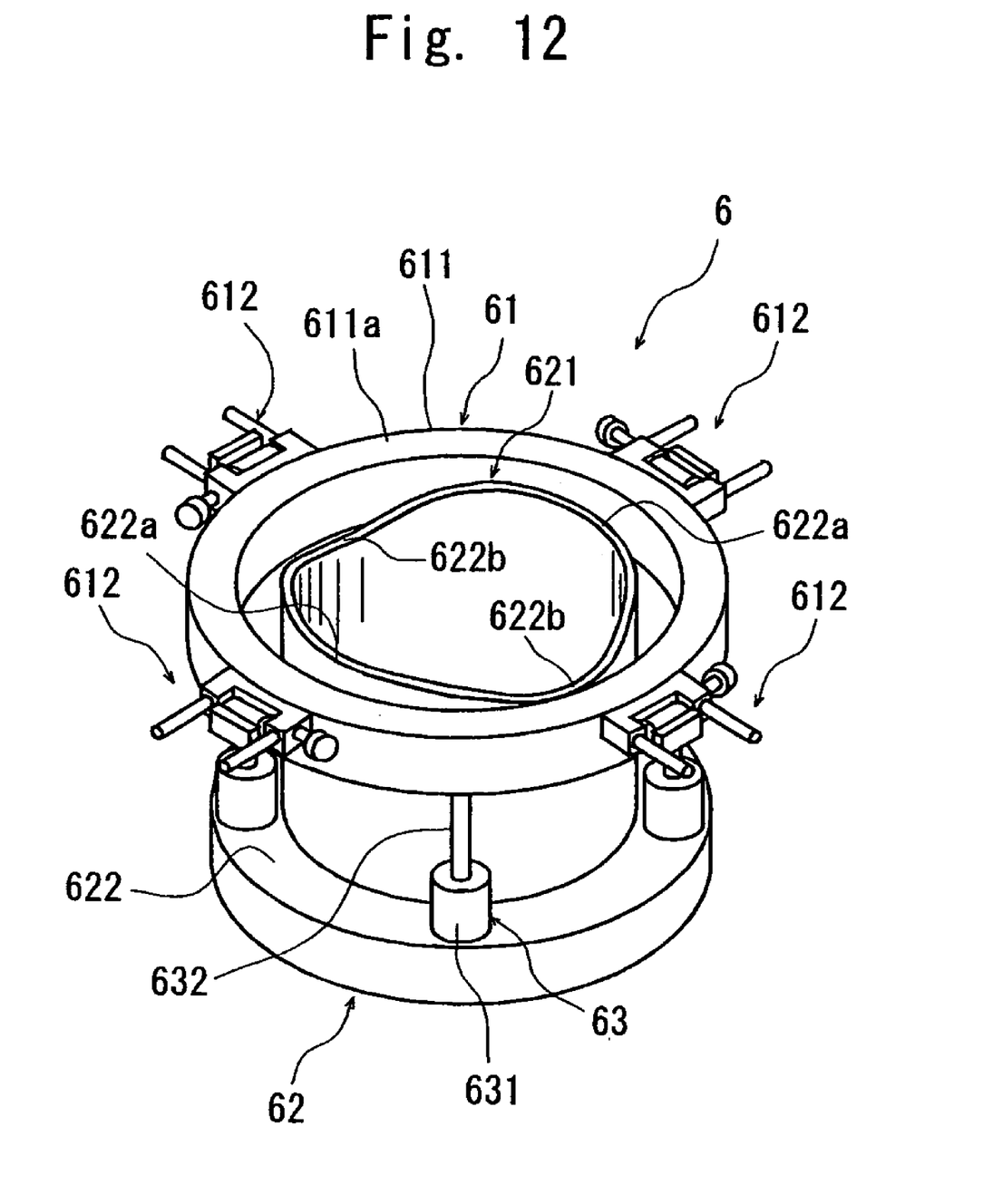
FIG. 12 is a perspective view of another embodiment of the tape expanding apparatus for carrying out the dividing step in the wafer dividing method of the present invention.
Figure 13:
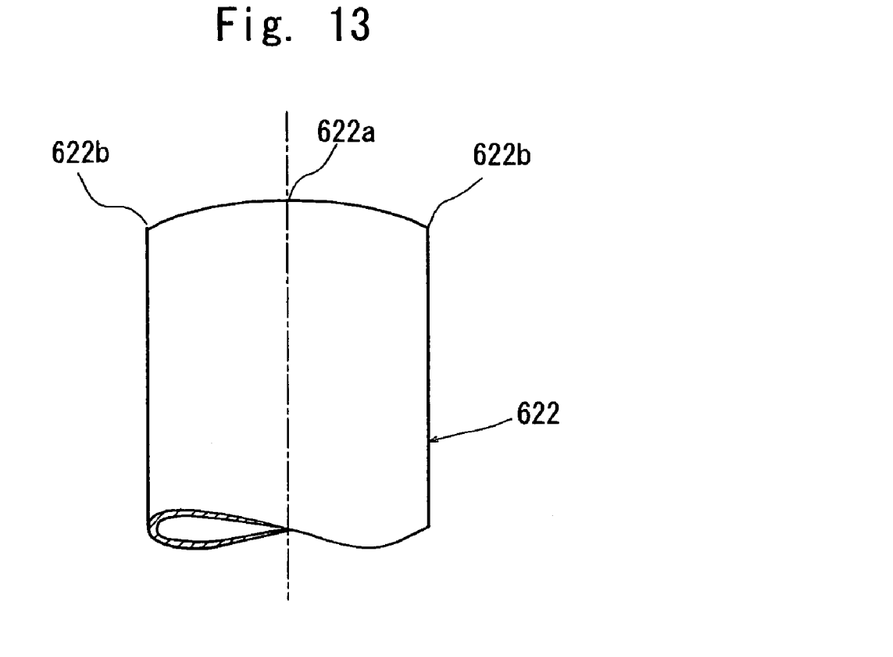
FIG. 13 is a side view of an expansion drum provided in the tape expanding apparatus shown in FIG. 12.
Figure 14:
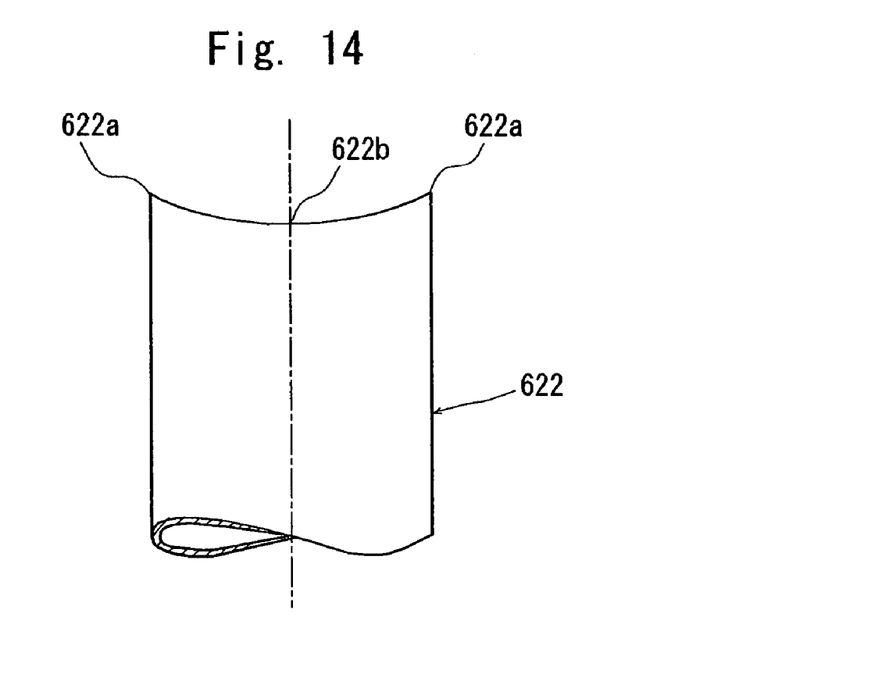
FIG. 14 is a side view of a state where the expansion drum shown in FIG. 13 has been changed the phase by 90° from that of FIG. 13.

A description will be subsequently given of a second embodiment of the dividing step for dividing the semiconductor wafer 2 into individual chips along the first dividing lines 211 and the second dividing lines 212 in which the deteriorated layer 210 has been formed. This second embodiment of the dividing step is carried out by using a tape expanding apparatus 6 shown in FIGS. 12 to 14. The tape expanding apparatus 6 shown in FIGS. 12 to 14 is the same as the tape expanding apparatus 6 shown in FIG. 8 except for the number of the clamps 612 provided on the annular frame holding member 611 constituting the frame holding means 61 and the structure of the expansion drum 622 constituting the tape expanding means 62, which differ from those of the tape expanding apparatus 6 shown in FIG. 8. Therefore, the constituent members of the tape expanding apparatus 6 shown in FIGS. 12 to 14 are given the same reference symbols as those of the tape expanding apparatus 6 shown in FIG. 8, and their descriptions are omitted.

The tape expanding apparatus 6 shown in FIGS. 12 to 14 comprises four clamps 612, which are arranged around the annular frame holding member 611 constituting frame holding means 61 at equal intervals. Higher portions 622a and lower portions 622b are formed at a phase of 90° from each other alternately at the upper edge of the expansion drum 622 constituting the tape expanding means 62 as exaggeratingly shown in FIGS. 13 and 14. Therefore, a pair of higher portions 622a and 622a and a pair of lower portions 622b and 622b which are opposed to each other are formed at the upper edge of the expansion drum 622. Gentle curves are formed between the higher portions 622a and the lower portions 622b.

Figure 15:
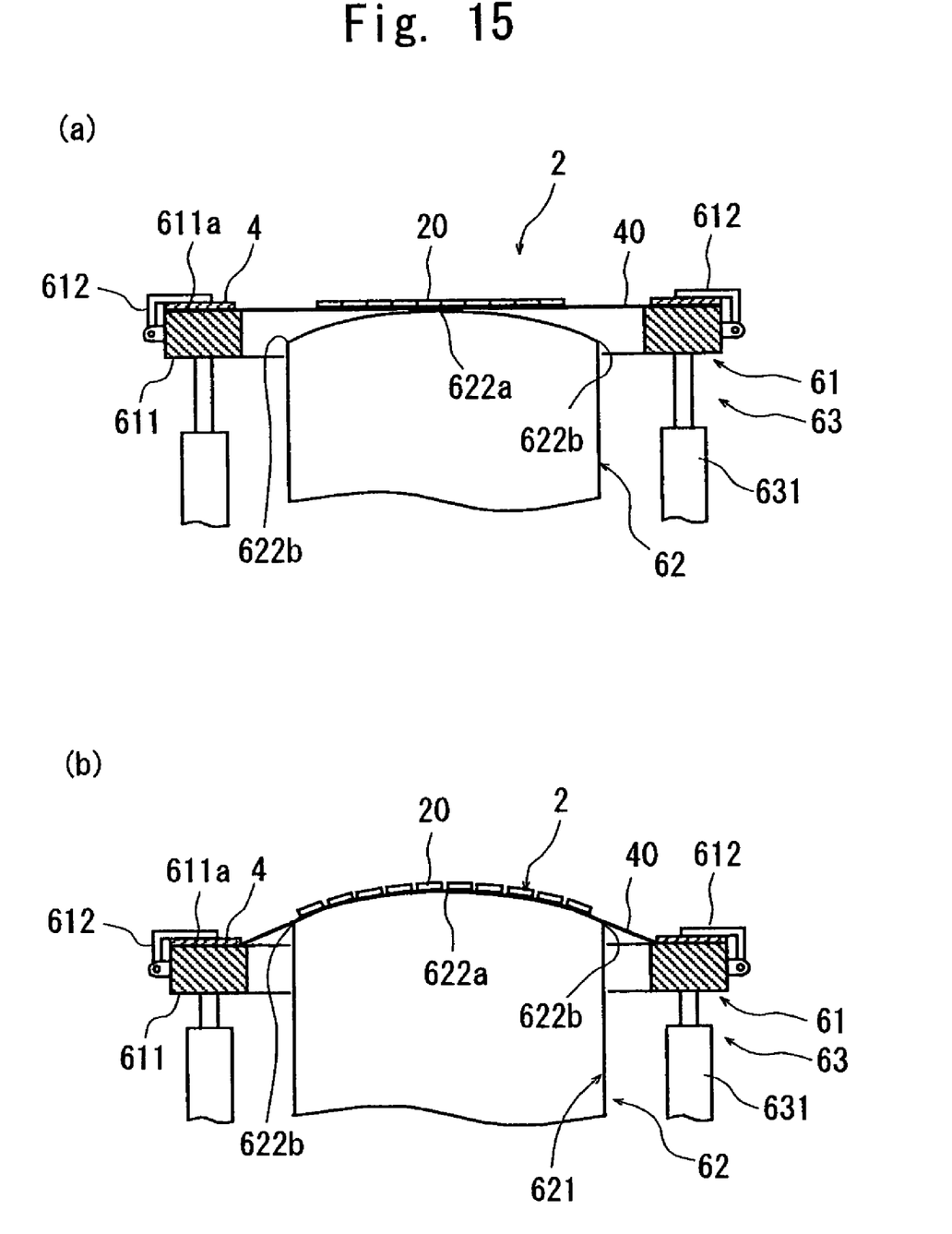

The dividing step which is carried out by using the tape expanding apparatus 6 shown in FIGS. 12 to 14 will be described with reference to FIGS. 15(a) and 15(b). That is, as shown in FIG. 15(a), the annular frame 4 supporting the semiconductor wafer 2 (in which the deteriorated layer 210 has been formed along the first dividing lines 211 and the second dividing lines 212) via the support tape 40 is placed on the placing surface 611a of the frame holding member 611 constituting the frame holding means 61, and fixed onto the frame holding member 611 by the four clamps 612. At this point, the annular frame 4 is positioned such that the first dividing lines 211 formed on the semiconductor wafer 2 affixed to the support tape 40 become perpendicular (direction perpendicular to the sheet in FIG. 15(a)) to a direction (horizontal direction in FIG. 15(a)) for connecting the lower portions 622b and center portion of the expansion drum 622 as shown in FIG. 15(a). Further, the frame holding member 611 is situated at the standard position shown in FIG. 15(a) at this point.

Thereafter, the annular frame holding member 611 is lowered to the expansion position shown in FIG. 15(b) by activating the plurality of air cylinders 631 as the support means 63 of the tape expanding means 62 (tape expanding step). Therefore, the annular frame 4 fixed on the placing surface 611a of the frame holding member 611 is also lowered, whereby the support tape 40 mounted on the annular frame 4 comes into contact with the upper edge of the expansion drum 621 to be expanded as shown in FIG. 15(b). At this moment, since the upper edge of the expansion drum 621 has the pair of higher portions 622a and 622a and the pair of lower portions 622b and 622b, the support tape 40 is pushed up in an arc as shown in FIG. 15(b). Consequently, as for tensile force acting on semiconductor wafer 2 affixed to the support tape 40, tensile force acting in a direction intersecting with the first dividing lines 211 becomes larger than tensile force acting in a direction intersecting with the second dividing lines 212. As a result, the semiconductor wafer 2 is first fractured along the first dividing lines 211 and subsequently, along the second dividing lines 212 to be divided into individual semiconductor chips 20.

A description will be subsequently given of the wafer dividing method according to another embodiment of the present invention.

Figure 16:
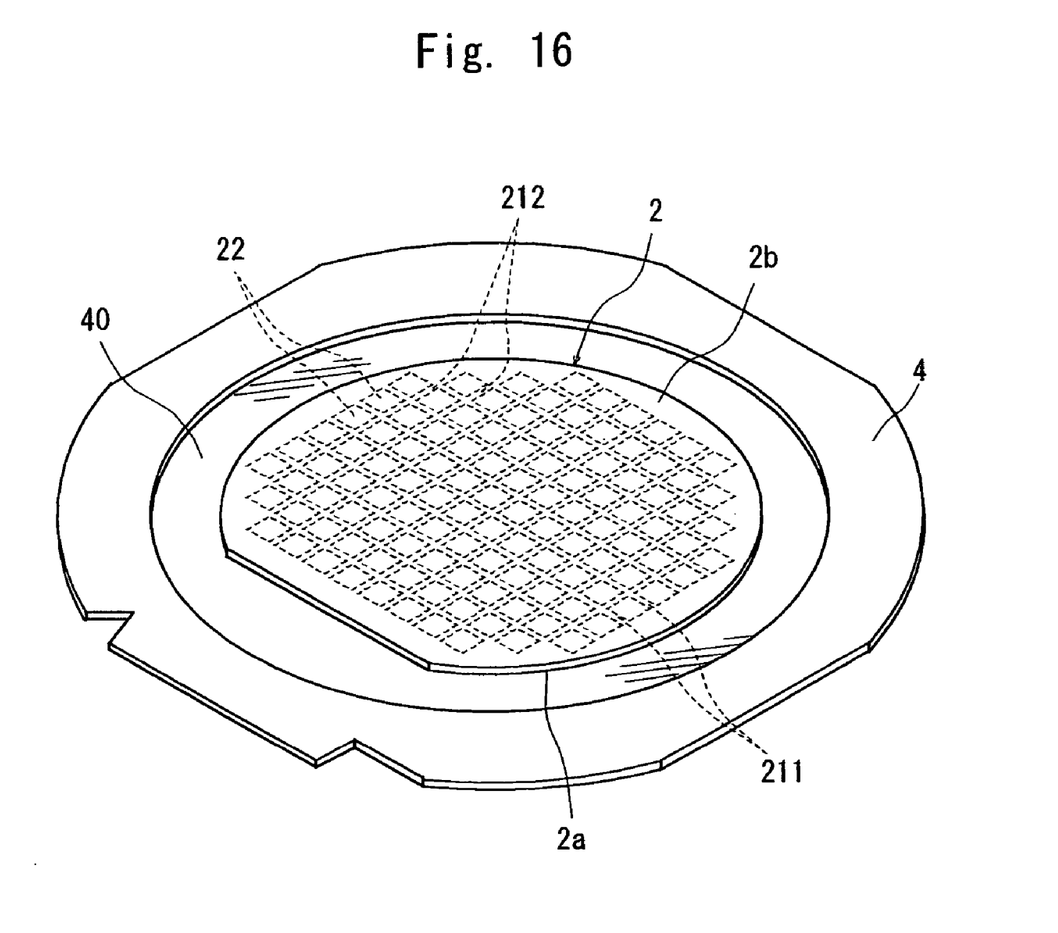
FIG. 16 is a perspective view showing a state where the front surface of a wafer has been put on the surface of the support tape mounted on the annular frame in the wafer supporting step in another embodiment of the wafer dividing method of the present invention.

In this embodiment, a wafer supporting step for putting the front surface of the semiconductor wafer on the surface of the support tape mounted on the annular frame is first carried out. That is, as shown in FIG. 16, the front surface 2a of the semiconductor wafer 2 is put on the surface of the support tape 40 mounted on the annular frame 4 as shown in FIG. 16 (therefore, the back surface 2b of the semiconductor wafer 2 faces up). The annular frame 4 and the support tape 40 may be identical to the annular frame 4 and the support tape 40 in the embodiment shown in FIG. 7, respectively After the above wafer supporting step, next comes a deteriorated layer forming step for forming a deteriorated layer in the inside of the semiconductor wafer 2 along the first dividing lines 211 and the second dividing lines 212 by applying a pulse laser beam capable of passing through the semiconductor wafer 2 along the first dividing lines 211 and the second dividing lines 212. This deteriorated layer forming step is carried out by using the laser beam processing machine 3 shown in FIGS. 2 to 4. The support tape 40 side of the semiconductor wafer 2 is held on the chuck table 31 (therefore, the back surface 2b of the semiconductor wafer 2 faces up), and a laser beam is applied, from the back surface 2b of the semiconductor wafer 2, along the first dividing lines 211 and the second dividing lines 212 in the same manner as described above to form the deteriorated layer in the inside of the semiconductor wafer 2 along the first dividing lines 211 and the second dividing lines 212.

A dividing step for dividing the semiconductor wafer 2 along the first dividing lines 211 and the second dividing lines 212 in which the deteriorated layer has been formed comes after the deteriorated layer forming step. The dividing step is carried out by using the tape expanding apparatus 6 shown in FIG. 8 or the tape expanding apparatus 6 shown in FIG. 12. The support tape 40 side of the annular frame 4 is placed on the placing surface 611a of the frame holding member 611 to expand the support tape 40 in the same manner as described above so as to divide the semiconductor wafer 2 along the first dividing lines 211 and the second dividing lines 212 in which the deteriorated layer has been formed.

As described above, the above deteriorated layer forming step and dividing step can be carried out while the wafer is supported to the annular frame via the support tape by first carrying out the wafer supporting step for putting the front surface of the semiconductor wafer on the surface of the support tape mounted on the annular frame.

What is claimed is:

1. A method of dividing a wafer having function elements formed in areas sectioned by dividing lines formed in a lattice pattern on the front surface, into individual chips along the dividing lines, comprising:
   a deteriorated layer forming step for forming a deteriorated layer along the dividing lines in the inside of the wafer by applying a laser beam capable of passing through the wafer along the dividing lines, from the back surface side of the wafer;
   a wafer supporting step for putting the back surface of the wafer in which the deteriorated layer has been formed along the dividing lines, on an extensible support tape mounted on an annular frame; and
   a dividing step for dividing the wafer along the dividing lines in which the deteriorated layer has been formed, by expanding the support tape affixed to the wafer, wherein
   the dividing step is to first divide the wafer along dividing lines extending in a predetermined direction and subsequently, along dividing lines extending in a direction intersecting with the predetermined direction by expanding the support tape such that tensile force acting in a direction perpendicular to the dividing lines extending in the predetermined direction becomes larger than tensile force acting in a direction perpendicular to the dividing lines extending in the direction intersecting with the predetermined direction, when the supporting tape affixed to the wafer is expanded.

2. The wafer dividing method according to claim 1, wherein in the above dividing step, a tape expanding apparatus comprising an annular frame holding member for holding an annular frame and an expansion drum, which is arranged within the annular frame holding member and moves relative to the annular frame holding member in an axial direction to expand a support tape, is used; when the annular frame is held on the annular frame holding member, the annular frame is fixed to the annular frame holding member at positions opposed to each other and perpendicular to the dividing lines that extend in the predetermined direction and are formed on the wafer supported to the annular frame via the support tape; and the annular frame is slightly deformed due to tensile force acting on the support tape at the time when the support tape is expanded by moving the expansion drum and the annular frame holding member relative to each other.

3. The wafer dividing method according to claim 1, wherein in the above dividing step, a tape expanding apparatus comprising an annular frame holding member for holding the annular frame and an expansion drum, which is arranged within the annular frame holding member and moves relative to the annular frame holding member in an axial direction to expand the support tape, the upper edge acting on the support tape of the expansion drum having higher portions and lower portions formed alternately at a phase of 90°, is used; the annular frame is held on the annular frame holding member in such a manner that the dividing lines that are formed on the wafer supported to the annular frame via the support tape and extend in the predetermined direction become perpendicular to a direction for connecting the lower portions of the expansion drum at the time when the annular frame is held on the annular frame holding member; and the upper edge of the expansion drum is caused to act on the support tape so as to expand the support tape by moving the expansion drum and the annular frame holding member relative to each other.

4. A method of dividing a wafer having function elements formed in areas sectioned by dividing lines formed in a lattice pattern on the front surface into individual chips along the dividing lines, comprising:
   a frame supporting step for putting the front surface of the wafer on an extensible support tape mounted on an annular frame;
   a deteriorated layer forming step for forming a deteriorated layer in the inside of the wafer along the dividing lines by applying a laser beam capable of passing through the wafer along the dividing lines, from the back surface side of the wafer supported to the annular frame via the support tape; and
   a dividing step for dividing the wafer along the dividing lines in which the deteriorated layer has been formed, by expanding the support tape affixed to the wafer, wherein
   the dividing step is to first divide the wafer along dividing lines extending in a predetermined direction and subsequently, along dividing lines extending in a direction intersecting with the predetermined direction by expanding the support tape such that tensile force acting in a direction perpendicular to the dividing lines extending in the predetermined direction becomes larger than tensile force acting in a direction perpendicular to the dividing lines extending in the direction intersecting with the predetermined direction, when the supporting tape affixed to the wafer is expanded.

5. The wafer dividing method according to claim 4, wherein in the above dividing step, a tape expanding apparatus comprising an annular frame holding member for holding an annular frame and an expansion drum, which is arranged within the annular frame holding member and moves relative to the annular frame holding member in an axial direction, to expand a support tape is used; when the annular frame is held on the annular frame holding member, the annular frame is fixed to the annular frame holding member at positions opposed to each other and perpendicular to the dividing lines that are formed on the wafer supported to the annular frame via the support tape and extend in the predetermined direction; and the annular frame is slightly deformed due to tensile force acting on the support tape at the time when the support tape is expanded by moving the expansion drum and the annular frame holding member relative to each other.

6. The wafer dividing method according to claim 4, wherein in the above dividing step, a tape expanding apparatus comprising an annular frame holding member for holding the annular frame and an expansion drum, which is arranged within the annular frame holding member and moves relative to the annular frame holding member in an axial direction to expand the support tape, the upper edge acting on the support tape of the expansion drum having higher portions and lower portions formed alternately at a phase of 90°, is used; the annular frame is held on the annular frame holding member in such a manner that the dividing lines that are formed on the wafer supported to the annular frame via the support tape and extend in the predetermined direction become perpendicular to a direction for connecting the lower portions of the expansion drum at the time when the annular frame is held on the annular frame holding member; and the upper edge of the expansion drum is caused to act on the support tape so as to expand the support tape by moving the expansion drum and the annular frame holding member relative to each other.

* * * * *